United States Patent
Chen

(10) Patent No.: US 8,217,494 B2
(45) Date of Patent: Jul. 10, 2012

(54) ELECTROSTATIC DISCHARGE PROTECTION DEVICE

(75) Inventor: Te-Wei Chen, Zhubei (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 242 days.

(21) Appl. No.: 12/814,699

(22) Filed: Jun. 14, 2010

(65) Prior Publication Data

US 2011/0089535 A1    Apr. 21, 2011

(30) Foreign Application Priority Data

Oct. 21, 2009   (TW) .............................. 98135562 A

(51) Int. Cl.
*H01L 29/73*   (2006.01)
*H01L 29/735*   (2006.01)

(52) U.S. Cl. ............... 257/577; 257/565; 257/E29.174; 257/E29.187

(58) Field of Classification Search .................. 257/565, 257/577, E29.174, E29.187
See application file for complete search history.

(56) References Cited

U.S. PATENT DOCUMENTS

| | | | | |
|---|---|---|---|---|
| 7,245,467 B2* | 7/2007 | Yeh et al. | ......................... | 361/56 |
| 7,642,621 B2* | 1/2010 | Takahashi | ...................... | 257/566 |
| 7,825,473 B2* | 11/2010 | Ker et al. | ........................ | 257/355 |
| 7,834,400 B2* | 11/2010 | Huang | .......................... | 257/355 |
| 8,049,250 B2* | 11/2011 | Song et al. | ...................... | 257/173 |
| 2005/0012155 A1* | 1/2005 | Ker et al. | ........................ | 257/355 |
| 2007/0290266 A1* | 12/2007 | Ker et al. | ...................... | 257/355 |
| 2008/0277728 A1* | 11/2008 | Huang | .......................... | 257/357 |
| 2009/0302423 A1* | 12/2009 | Takahashi et al. | ............. | 257/578 |
| 2010/0103570 A1* | 4/2010 | Song et al. | ...................... | 361/56 |
| 2010/0176362 A1* | 7/2010 | Lung et al. | ........................ | 257/2 |
| 2012/0018845 A1* | 1/2012 | Lung et al. | ..................... | 257/565 |
| 2012/0037956 A1* | 2/2012 | Song et al. | ...................... | 257/173 |

* cited by examiner

*Primary Examiner* — Victor A Mandala
(74) *Attorney, Agent, or Firm* — Thomas|Kayden

(57) ABSTRACT

The invention provides an electrostatic discharge (ESD) protection device having an ESD path between a first circuit and a second circuit. The electrostatic discharge protection device includes a first doped region having a first conductive type. A first well has a second conductive type opposite to the first conductive type. A second doped region and a third doped region are in the first well, respectively having the first and second conductive types. The first doped region is coupled to a power supply terminal or a ground terminal of the first circuit, and the second and third doped regions are both coupled to a power supply terminal or a ground terminal of the second circuit, respectively.

22 Claims, 16 Drawing Sheets

ELECTROSTATIC DISCHARGE PROTECTION DEVICE

CROSS REFERENCE TO RELATED APPLICATIONS

This Application claims priority of Taiwan Patent Application No. 098135562, filed on Oct. 21, 2009, the entirety of which is incorporated by reference herein.

BACKGROUND OF THE INVENTION

1. Field of the Invention

The present invention relates to an electrostatic discharge protection (ESD) device, and in particular, to an electrostatic discharge protection (ESD) device coupled between two circuits.

2. Description of the Related Art

Semiconductor devices, may suffer from electrostatic discharge (ESD) damage when being fabricated, assembled, delivered, tested or applied. Thus, ESD protection is required for semiconductor devices to prevent against ESD damage and insure quality thereof.

FIG. 1a is a schematic view of a conventional power cut cell 50 coupled between two circuits 20a and 20b. The conventional power cut cell 50 is constructed by a diode series module 52 and a reverse diode series module 54 in parallel connection. The diode series module 52 is constructed by two diodes 52a in series connection and the diode series module 54 is constructed by two diodes 54a in series connection. The conventional power cut cell 50 coupled between a voltage power supply terminal VCC1/ground terminal GND1 of the circuit 20a and a voltage power supply terminal VCC2/ground terminal GND2 of the circuit 20b has an ESD path therebetween. For example, if the voltage power supply terminal VCC1/ground terminal GND1 of the circuit 20a encounters ESD current zapping, the diode series module 52 of the conventional power cut cell 50 in a forward-bias operation would thereby turn on the conventional power cut cell 50. Thus, the conventional power cut cell 50 would transmit the ESD transient current to the corresponding voltage power supply terminal VCC2/ground terminal GND2 of the circuit 20b. Alternatively, if the voltage power supply terminal VCC2/ground terminal GND2 of the circuit 20b encounters ESD current zapping, the diode series module 52 of the conventional power cut cell 50 in a forward-bias operation would thereby turn off the conventional power cut cell 50. The conventional power cut cell 50 would transmit the ESD transient current to the corresponding voltage power supply terminal VCC1/ground terminal GND1 of the circuit 20a, thereby preventing a secured device 10a in the circuit 20a or a secured device 10b in the circuit 20b from ESD damage. Additionally, the conventional power cut cell 50 constructed by diodes may be designed with noise isolation for the circuit 20a or 20b when the conventional power cut cell 50 is turned off.

FIG. 1b is an equivalent circuit diagram of the conventional power cut cell 50 as shown in FIG. 1a. A parasitic resistance is formed between the N-well or P-well regions because the conventional power cut cell 50 is constructed by a PN diode formed by N-wells or P-wells. As shown in FIG. 1b, an equivalent circuit of the diodes 52a of the diode series module 52 can serve as an ideal diode $52a_1$ with zero impedance, which is series connected to a parasitic resistance $52a_2$. The parasitic resistance, however, hinders transmission of the ESD transient current. While the well area can be increased to reduce the parasitic resistance of the conventional power cut cell 50, total device area would increase and thereby counter the desired trends for high device density.

FIG. 2 is a schematic view of another conventional power cut cell 30. To reduce the parasitic resistance of the power cut cell, a power cut cell 30 comprising of a metal-oxide-silicon (MOS) transistor 32 and a reverse MOS transistor 34 in parallel connection can be used. When an ESD transient current is larger than a threshold voltage of the MOS transistor, the MOS transistors 32 and 34 are turned on, thereby transmitting the ESD transient current from the voltage power supply terminal VCC1/ground terminal GND1 of one circuit to a corresponding voltage power supply terminal VCC2/ground terminal GND2 of another circuit. The power cut cell 30 can transmit the larger ESD transient current because the output impedance of the MOS transistors 32 and 34 that are turned on is much smaller than the parasitic resistances $52a_2$ or $54a_2$ of the conventional power cut cell 50 constructed by diodes. Additionally, the threshold voltage of the MOS transistors 32 and 34 helps to isolate noise from adjacent circuits. Thus, the ESD transient current is transmitted by reducing the output impedance of the power cut cell 30. However, like the conventional power cut cell 50 as shown in FIG. 1a, total device area is large, thereby countering the desired trends for high device density.

Thus, a high device density ESD protection device, which has low parasitic resistance when the ESD protection device is turned on and has good noise isolation when the ESD protection device is turned off, is desired.

BRIEF SUMMARY OF INVENTION

To solve the above-described problems, an electrostatic discharge protection (ESD) device is provided. An exemplary embodiment of an electrostatic discharge protection (ESD) device having an ESD path between a first circuit and a second circuit, comprises a first doped region having a first conductive type. A first well has a second conductive type opposite to the first conductive type. A second doped region and a third doped region are in the first well, respectively having the first and second conductive types, wherein the first doped region is coupled to a power supply terminal or a ground terminal of the first circuit, and the second and third doped regions are both coupled to a power supply terminal or a ground terminal of the second circuit, respectively.

Another exemplary embodiment of an electrostatic discharge protection (ESD) device in a substrate is provided, having an ESD path between a first circuit and a second circuit, wherein the ESD device comprises at least two ESD sub-devices, and each of the ESD sub-devices, comprises a first doped region having a first conductive type. A first well has a second conductive type opposite to the first conductive type. A second doped region and a third doped region are in the first well, respectively having the first and second conductive types, wherein the first doped region of one of the ESD sub-devices and the second and third doped regions of another one of the ESD sub-devices are coupled to a power supply terminal or a ground terminal of the first circuit, and the second and third doped regions of one of the ESD sub-devices and the first doped region of another one of the ESD sub-devices are both coupled to a power supply terminal or a ground terminal of the second circuit, respectively.

Yet another exemplary embodiment of an electrostatic discharge protection (ESD) device in a substrate is provided, having an ESD path between a first circuit and a second circuit, comprises a first doped region having a first conductive type. A second doped region and a third doped region, respectively have the first conductive type and a second conductive type opposite to the first conductive type, wherein the first doped region is coupled to a power supply terminal or a ground terminal of the first circuit, and the second and third doped regions are both coupled to a power supply terminal or a ground terminal of the second circuit, respectively.

Yet another exemplary embodiment of an electrostatic discharge protection (ESD) device in a substrate is provided, having an ESD path between a first circuit and a second circuit, wherein the ESD device comprises at least two ESD sub-devices, and each of the ESD sub-devices comprises a first doped region having a first conductive type. A second doped region and a third doped region respectively have the first conductive type and a second conductive type opposite to the first conductive type, wherein the first doped region of one of the ESD sub-devices and the second and third doped regions of another one of the ESD sub-devices are coupled to a power supply terminal or a ground terminal of the first circuit, and the second and third doped regions of one of the ESD sub-devices and the first doped region of another one of the ESD sub-devices are both coupled to a power supply terminal or a ground terminal of the second circuit, respectively.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 1b is an equivalent circuit diagram of the conventional power cut cell as shown in FIG. 1a.

DETAILED DESCRIPTION OF INVENTION

Figure 1A:
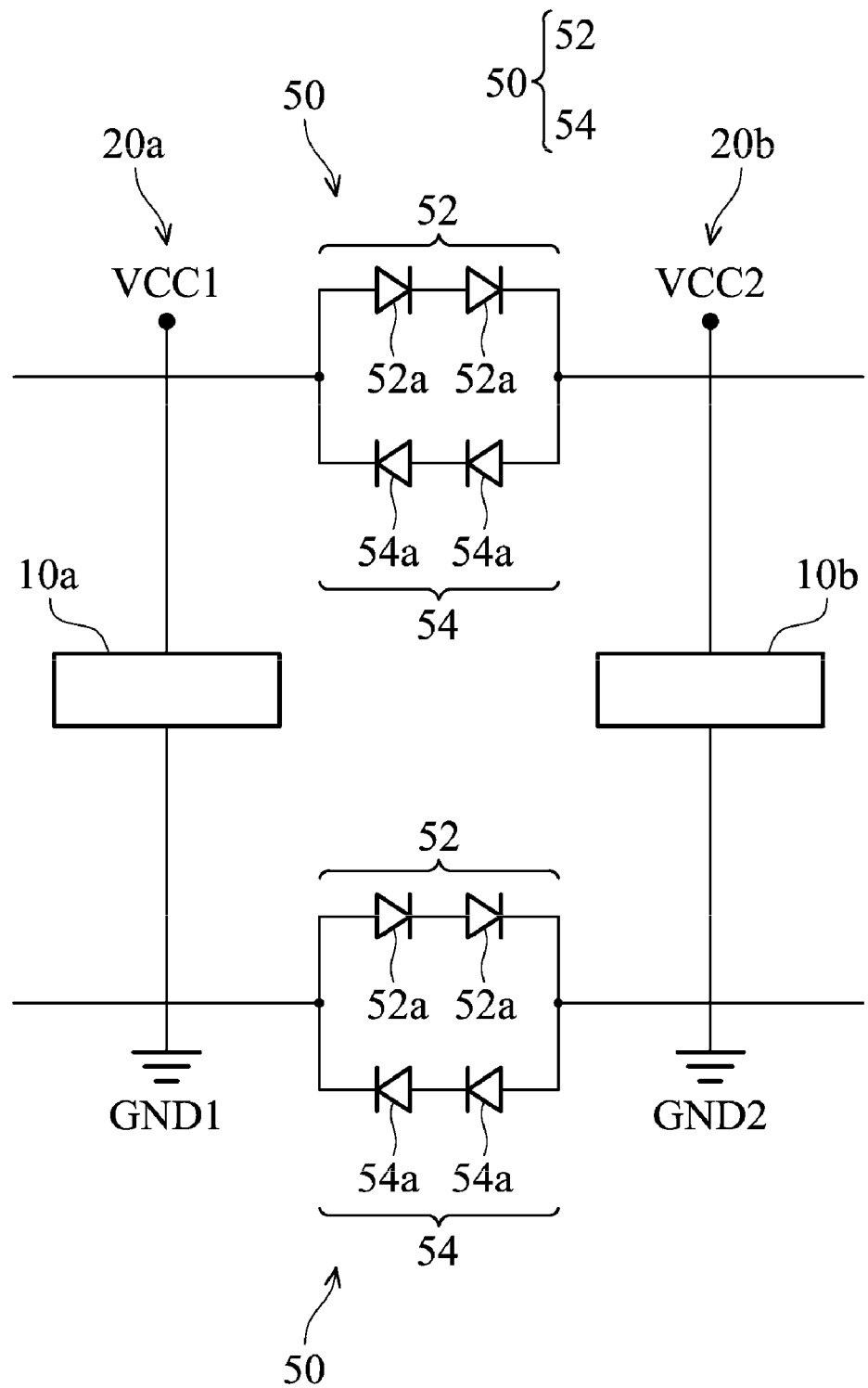
FIG. 1a is a schematic view of a conventional power cut cell.
Figure 1B:
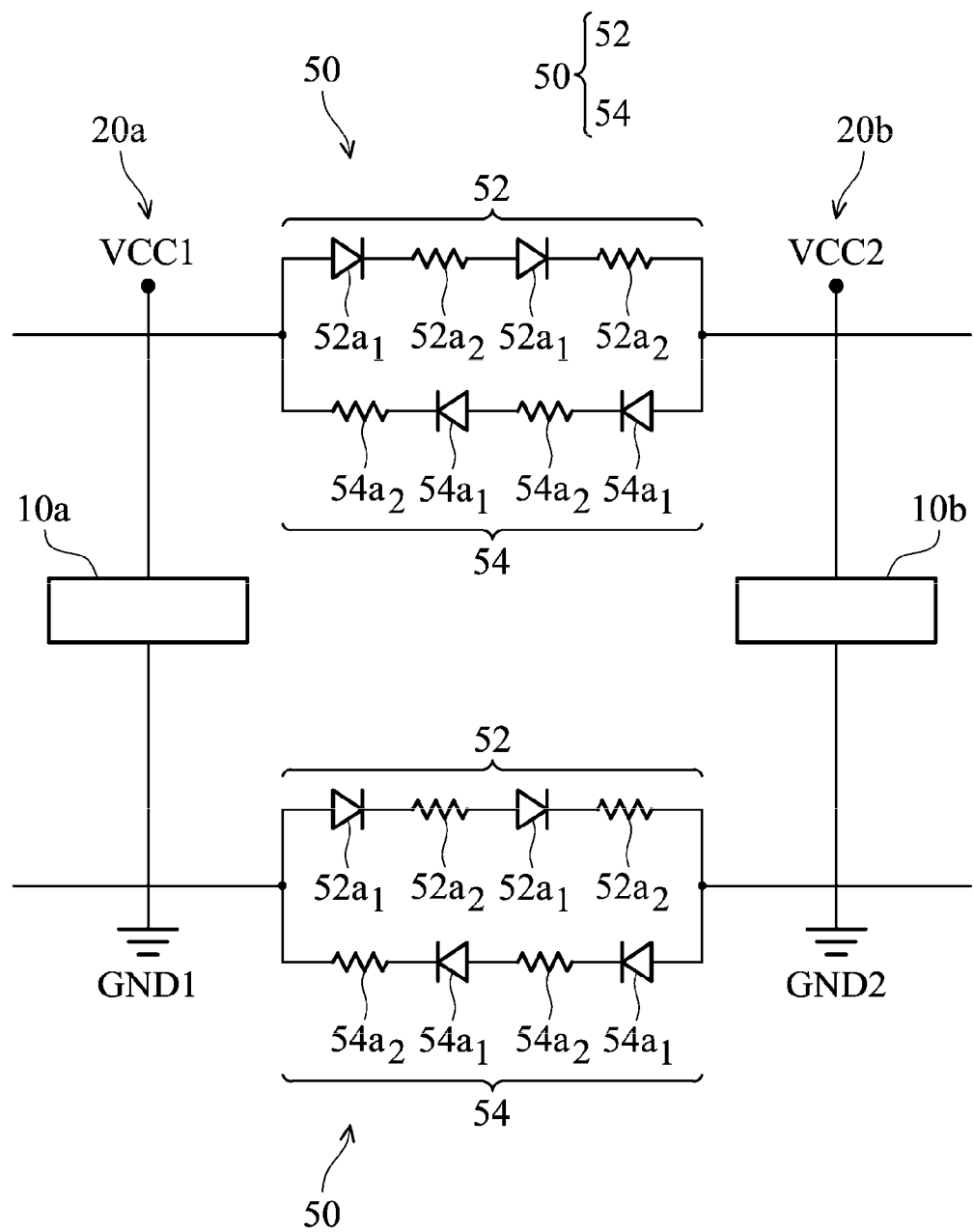
Figure 2:
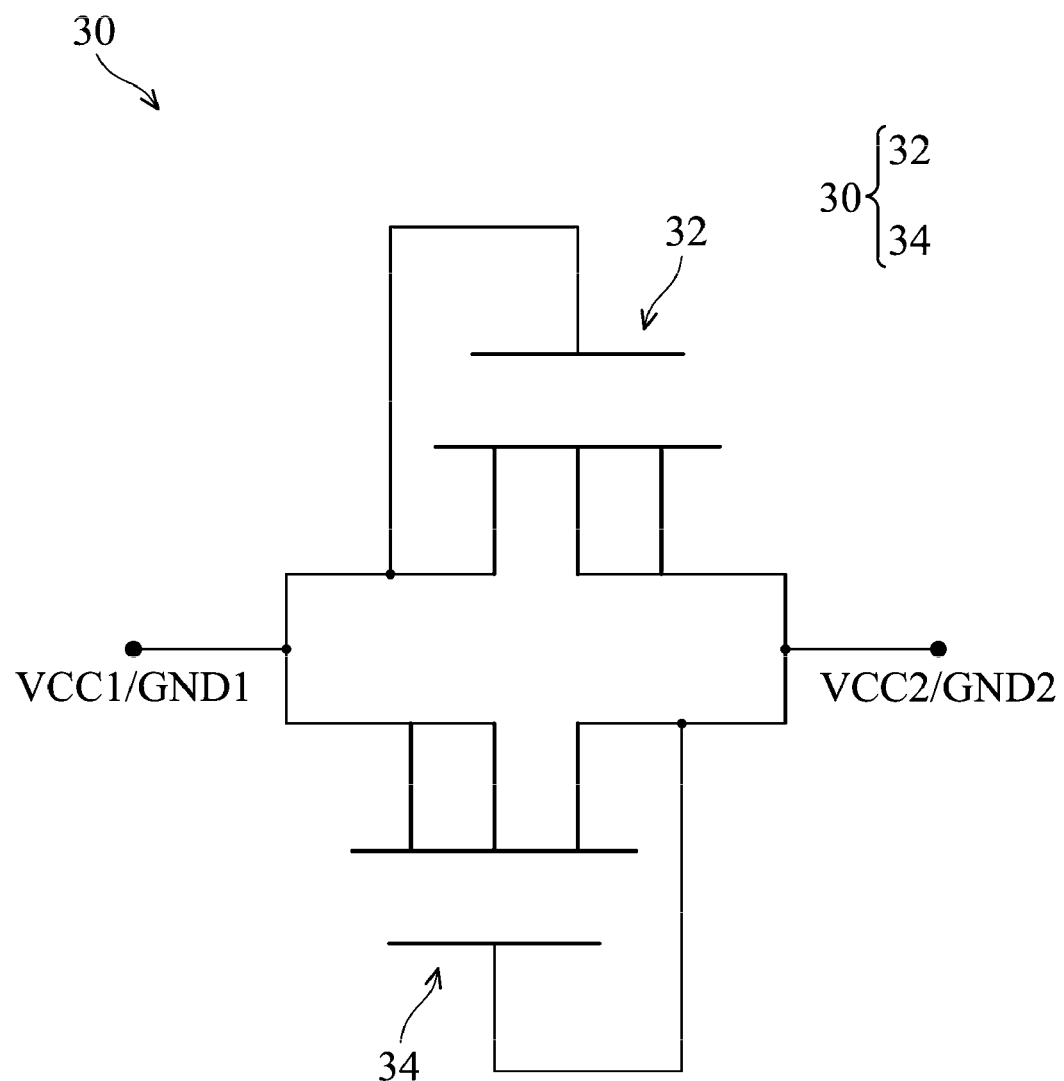
FIG. 2 is a schematic view of another conventional power cut cell.

The following description is of a mode for carrying out the invention. This description is made for the purpose of illustrating the general principles of the invention and should not be taken in a limiting sense. The scope of the invention is best determined by reference to the appended claims. Wherever possible, a community reference numbers are used in the drawings and the descriptions to refer a community or like parts.

Figure 3:
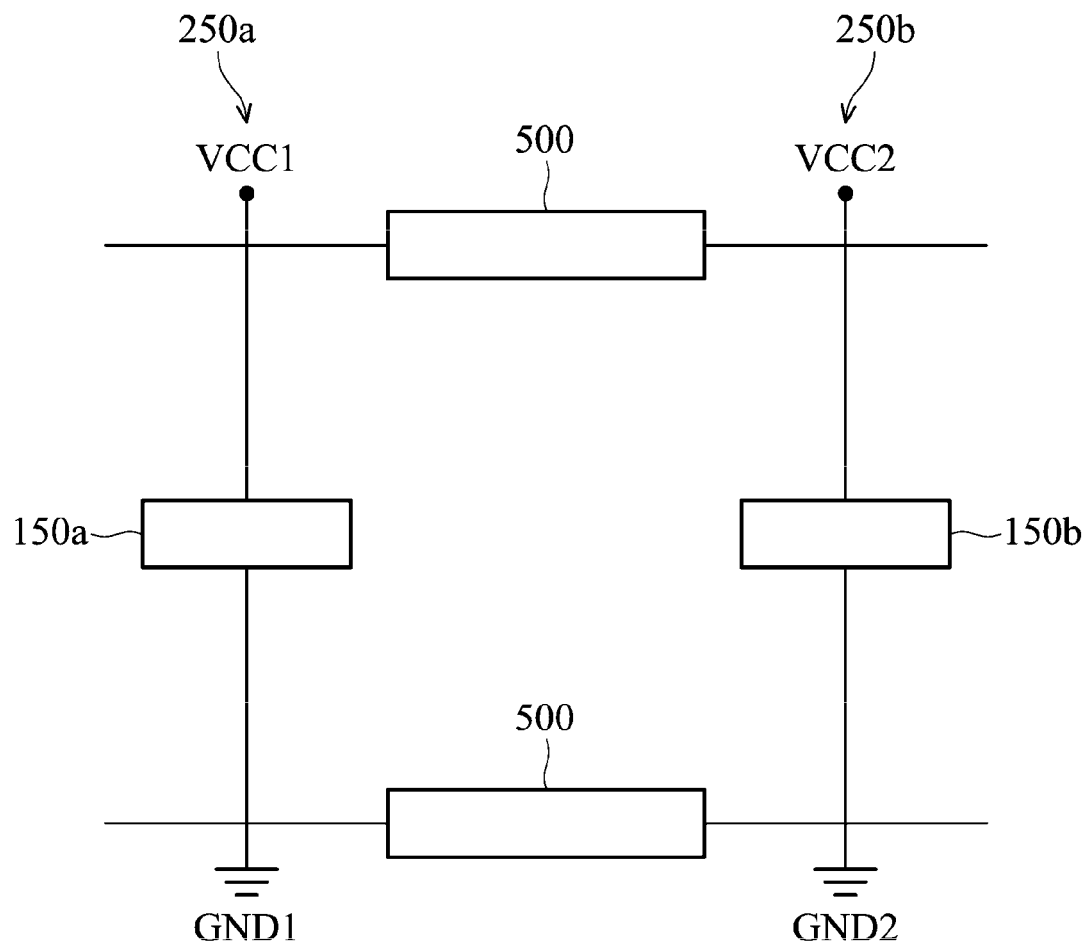
FIG. 3 is a schematic view showing one exemplary embodiment of the electrostatic discharge protection device of the invention.

FIG. 3 is a schematic view showing one exemplary embodiment of the electrostatic discharge (ESD) protection device 500 of the invention. As shown in FIG. 3, the ESD protection device 500 may be disposed between a first circuit 250a and a second circuit 250b. For example, the ESD protection device 500 may be coupled to a voltage power supply terminal VCC1 of the first circuit 250a and a voltage power supply terminal VCC2 of the second circuit 250b, or coupled to a ground terminal GND1 of the first circuit 250a and a ground terminal GND2 of the second circuit 250b. As shown in FIG. 3, secured devices 150a and 150b are respectively disposed between the power supply terminals and the ground terminals of the first circuit 250a and the second circuit 250b. One exemplary embodiment of the ESD protection device 500 may be used to provide an ESD path between the first circuit 250a and the second circuit 250b, thereby preventing the secured devices 150a and 150b from ESD damage that causes device failure.

Figure 4A:
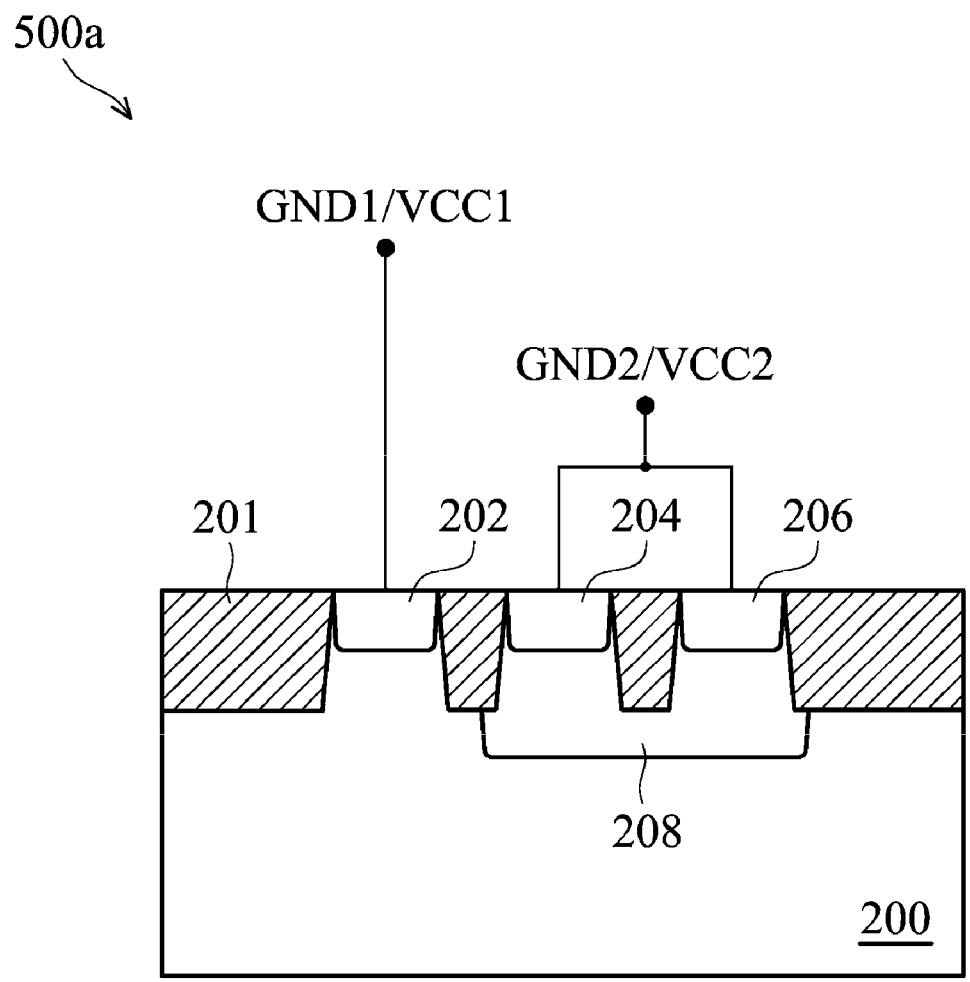
FIG. 4a is a cross section view showing one exemplary embodiment of the electrostatic discharge protection device of the invention.

FIG. 4a is a cross section view showing one exemplary embodiment of the ESD protection device 500a of the invention. As shown in FIG. 4a, the ESD protection device 500a is disposed in a substrate 200. The ESD protection device 500a may comprise a first doped region 202, a second doped region 204 and a third doped region 206 in a first well 208, wherein the first doped region 202 may be coupled to the voltage power supply terminal VCC1 or the ground terminal GND1 of the first circuit 250a as shown in FIG. 3. Also, the second doped region 204 and the third doped region 206 may be coupled to the voltage power supply terminal VCC2 or the ground terminal GND2 of the second circuit 250b as shown in FIG. 3. For example, if the first doped region 202 is coupled to the voltage power supply terminal VCC1 of the first circuit 250a as shown in FIG. 3, the second doped region 204 and the third doped region 206 are coupled to the corresponding voltage power supply terminal VCC2 of the second circuit 250b as shown in FIG. 3. Alternatively, the first doped region 202 may be coupled to the ground terminal GND1 of the first circuit 250a as shown in FIG. 3. Also, the second doped region 204 and the third doped region 206 are coupled to the corresponding ground terminal GND2 of the second circuit 250b as shown in FIG. 3.

As shown in FIG. 4a, the first doped region 202, the second doped region 204 and the third doped region 206 of one exemplary embodiment of the ESD protection device 500a are separated by a plurality of shallow trench isolation (STI) features 201. Also, the first doped region 202, the second doped region 204 and the third doped region 206 are adjacent to a surface of the substrate 200.

In one embodiment, the substrate 200 may comprise silicon. In alternative embodiments, SiGe, bulk semiconductor, strained semiconductor, compound semiconductor, silicon on insulator (SOI), or other commonly used semiconductor substrates. The substrate 200 may have a desired conductive type by implanting P-type or N-type dopants. In one embodiment, the substrate 200 may be a P-type substrate.

In one embodiment, the conductive type of the first doped region 202 and the second doped region 204 may be the same with that of the substrate 200. Meanwhile, the conductive type of the third doped region 206 and the first well 208 may be different from that of the substrate 200. Additionally, the doped concentration of the first doped region 202 and the second doped region 204 may be larger than that of the substrate 200, and the doped concentration of the third doped region 206 may be larger than that of the first well 208. For example, if the substrate 200 is a P-type substrate, the conductive type of the first doped region 202 and the second doped region 204 are P-type, and the conductive type of the third doped region 206 and the first well 208 are N-type. Therefore, in one embodiment as shown in FIG. 4a, if the conductive type of the substrate 200 is P-type, the ESD protection device 500a may serve as a parasitic PNP bipolar transistor (PNP BJT) 500a constructed by the first doped region 202 (e.g. P-doped region), the first well 208 (e.g. N-well), the third doped region 206 (e.g. N-doped region) and the second doped region 204 (e.g. P-doped region). The P-type first doped regions 202 may serve as an emitter of the parasitic PNP BJT 500a. The N-type first well 208 and the third doped region 206 may serve as a base of the parasitic PNP BJT 500a. The P-type second doped region 204 may serve as a collector of the parasitic PNP BJT 500a. FIG. 4c is an equivalent circuit diagram of FIG. 4a, wherein a resistor 401 may serve as a resistor providing internal resistance for the first well 208. The resistor 401 may be ignored during operation because the base and the collector of the parasitic PNP BJT 500a are coupled to the voltage power supply terminal VCC2 or the ground terminal GND2 of the second circuit 250b as shown in FIG. 3. That is to say, the resistor 401 can be omitted from FIG. 4c.

Figure 4B:
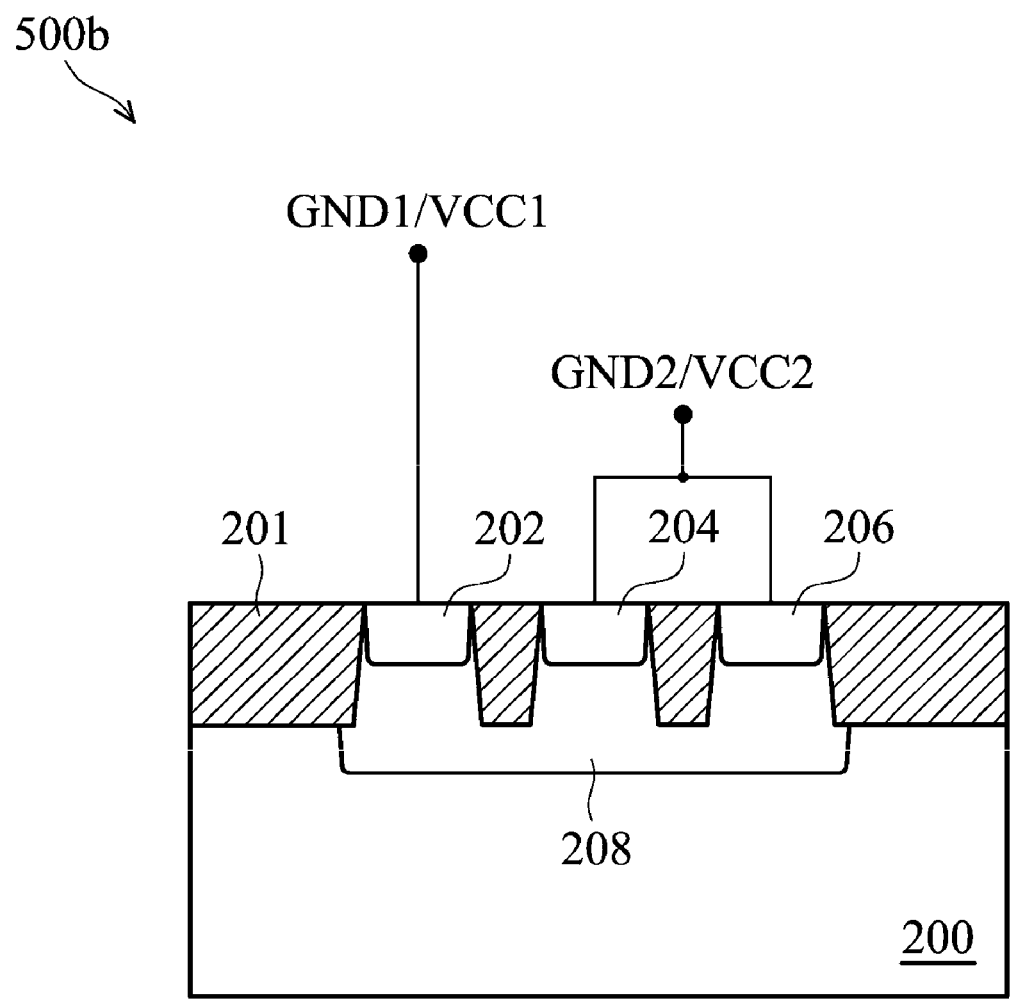
FIG. 4b is a cross section view showing another exemplary embodiment of the electrostatic discharge protection device of the invention.
Figure 4C:
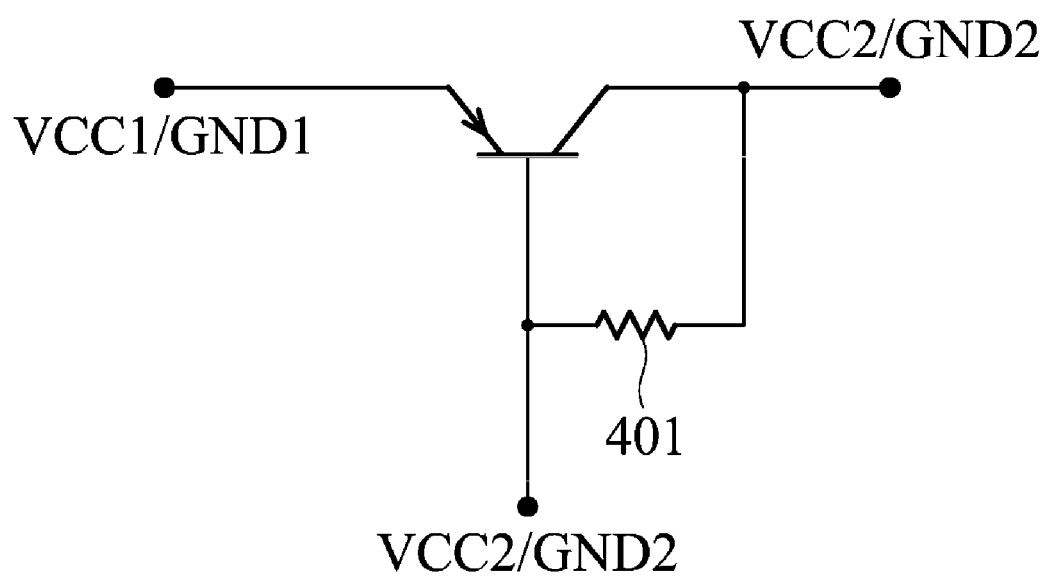
FIG. 4c is an equivalent circuit diagram of FIG. 4a and FIG. 4b.

FIG. 4b is a cross section view showing another exemplary embodiment of the electrostatic discharge protection device 500b of the invention. In another exemplary embodiment, all of the first doped region 202, the second doped region 204 and the third doped region 206 are in the first well 208. If the conductive type of the substrate 200 is P-type, the ESD protection device 500b may serve as a parasitic PNP bipolar transistor (PNP BJT) 500b constructed by the first doped region 202 (e.g. P-doped region), the first well 208 (e.g. N-well), the third doped region 206 (e.g. N-doped region) and the second doped region 204 (e.g. P-doped region). The P-type first doped regions 202 may serve as an emitter of the parasitic PNP BJT 500b. The N-type first well 208 and the third doped region 206 may serve as a base of the parasitic PNP BJT 500b. The P-type second doped region 204 may serve as a collector of the parasitic PNP BJT 500b. As shown in FIG. 4c, an equivalent circuit of the parasitic PNP BJT 500b is the same to that of the parasitic PNP BJT 500a. Similarly to the parasitic PNP BJT 500a, the resistor 401 may be ignored during operation because the base and the collector of the parasitic PNP BJT 500b are coupled to the voltage power supply terminal VCC2 or the ground terminal GND2 of the second circuit 250b as shown in FIG. 3.

In one embodiment, the ESD protection device 500a or 500b may be respectively coupled to the voltage power supply terminal VCC1 of the first circuit 250a and the voltage power supply terminal VCC2 of the second circuit 250b, wherein the first doped region 202 is coupled to the voltage power supply terminal VCC1 of the first circuit 250a as shown in FIG. 3, and the second doped region 204 and the third doped region 206 are coupled to the corresponding voltage power supply terminal VCC2 of the second circuit 250b as shown in FIG. 3. In one embodiment, if the voltage power supply terminal VCC1 of the first circuit 250a suffers from a transient ESD high voltage, the aforementioned parasitic PNP BJT 500a or 500b may have a forward biased emitter-base junction and a reverse biased base-collector junction. That is, the parasitic PNP BJT 500a or 500b would be in a forward-active mode operation. If the voltage power supply terminal VCC1 of the first circuit 250a encounters ESD current zapping, the parasitic PNP BJT 500a or 500b would provide a transmission path from the voltage power supply terminal VCC1 of the first circuit 250a to the voltage power supply terminal VCC2 of the second circuit 250b. Therefore, a high current injection may be induced from the emitter (the P-type first doped regions 202) to the base (the N-type first well 208 and the third doped region 206). Thus, the ESD protection device 500a or 500b would transmit the ESD transient current from the voltage power supply terminal VCC1 of the first circuit 250a to the voltage power supply terminal VCC2 of the second circuit 250b, thereby reducing voltage difference between the power supply terminals VCC1 and VCC2. Additionally, the ESD voltage from the voltage power supply terminal VCC1 of the first circuit 250a would be smaller than that of the turn on voltage of the parasitic PNP BJT 500a or 500b. The parasitic PNP BJT 500a or 500b may have noise isolation efficiency.

Similarly, in another embodiment, the ESD protection device 500a or 500b may respectively be coupled to the ground terminal GND1 of the first circuit 250a and the ground terminal GND2 of the second circuit 250b, wherein the first doped region 202 is coupled to the ground terminal GND1 of the first circuit 250a as shown in FIG. 3, and the second doped region 204 and the third doped region 206 are coupled to the corresponding ground terminal GND2 of the second circuit 250b as shown in FIG. 3. If the voltage power supply terminal VCC1 of the first circuit 250a encounters ESD current zapping, the ESD protection device 500a or 500b would transmit the ESD transient current from the voltage ground terminal GND1 of the first circuit 250a to the ground terminal GND2 of the second circuit 250b, thereby reducing voltage difference between the ground terminals GND1 and GND2. Additionally, the ESD voltage from the ground terminal GND1 of the first circuit 250a is smaller than that of the turn on voltage of the parasitic PNP BJT 500a or 500b. The parasitic PNP BJT 500a or 500b may have noise isolation efficiency.

Elements of the embodiments hereinafter, that are the same or similar as those previously described with reference to FIGS. 4a to 4c, are not repeated for brevity.

Figure 5A:
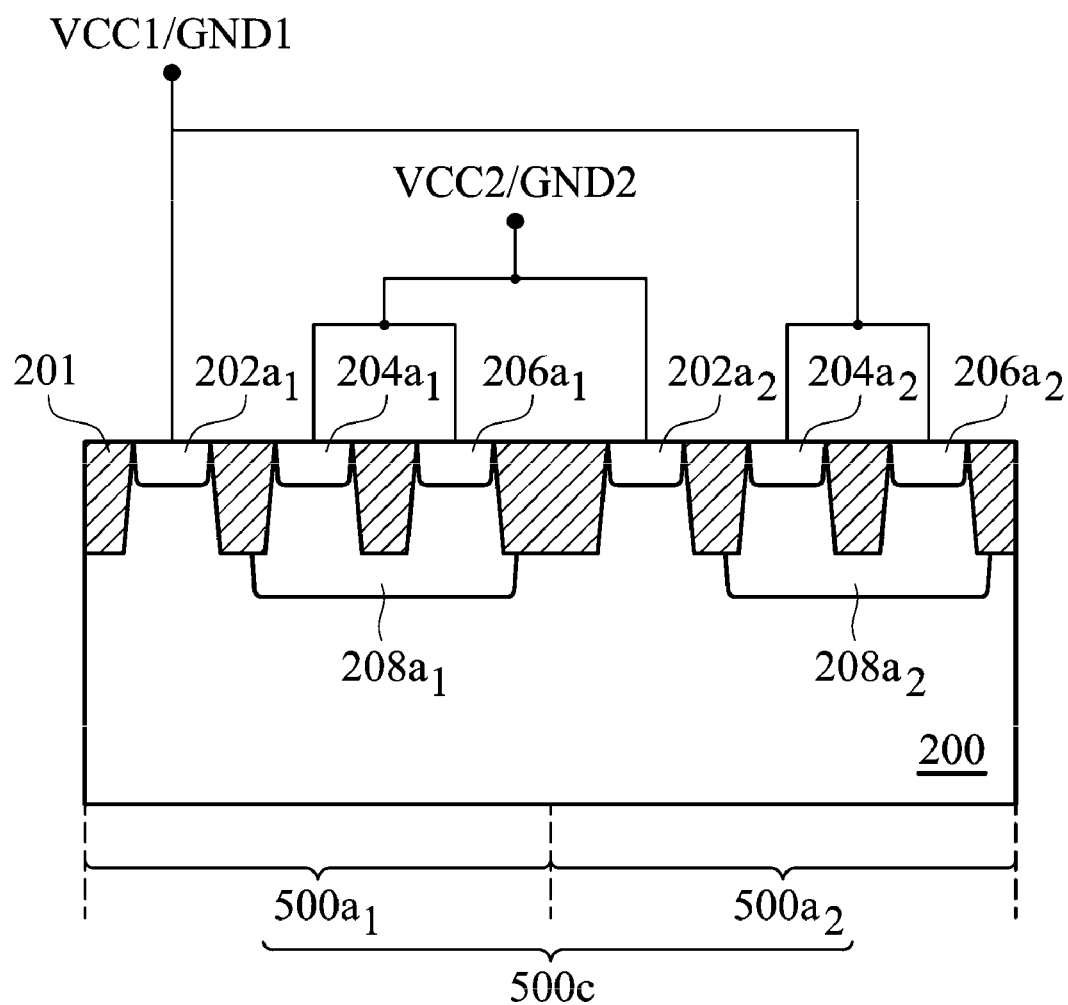
FIG. 5a is a cross section view showing yet another exemplary embodiment of the electrostatic discharge protection device of the invention.
Figure 5B:
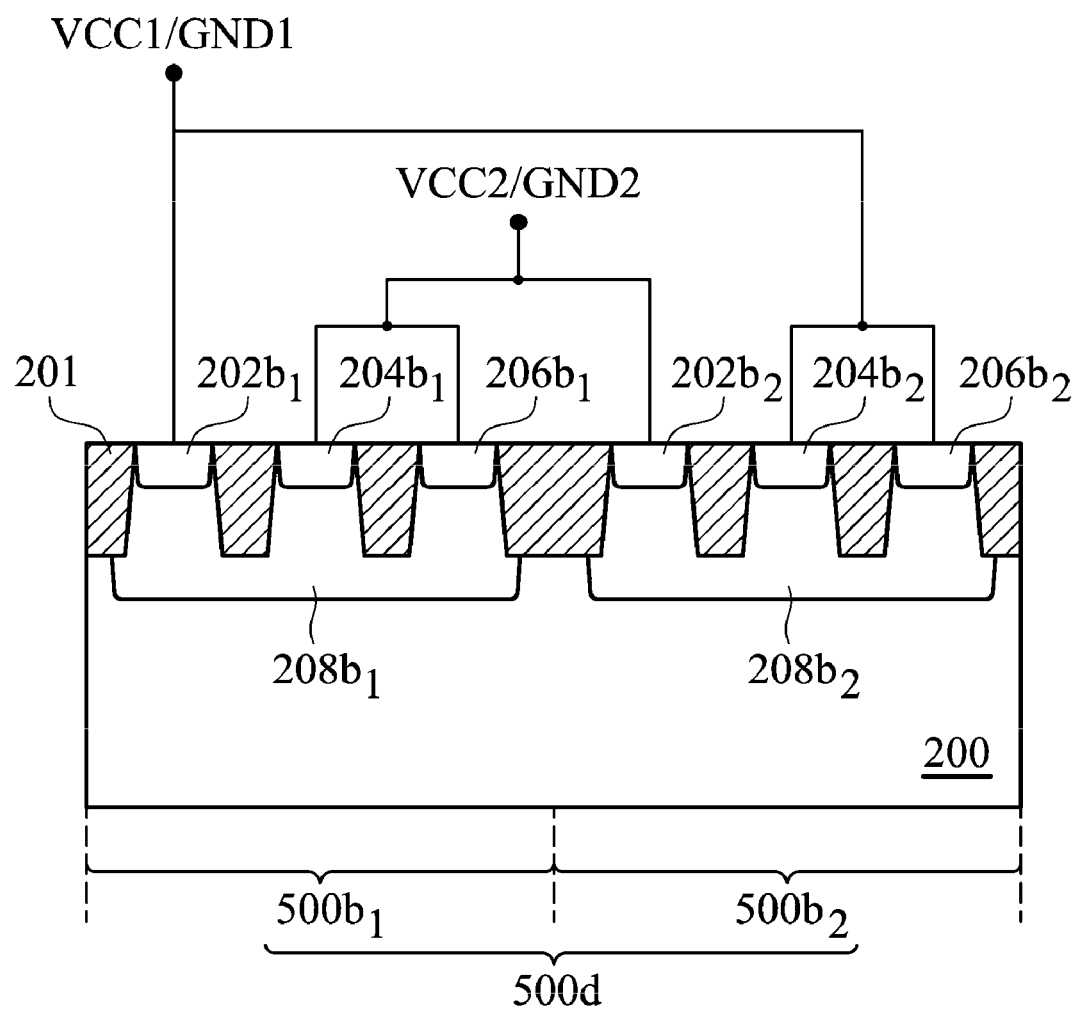
FIG. 5b is a cross section view showing yet another exemplary embodiment of the electrostatic discharge protection device of the invention.

FIGS. 5a and 5b are cross section views showing yet another exemplary embodiments of the electrostatic discharge protection devices 500c and 500d of the invention. Alternatively, ESD may occur from the voltage power supply terminals VCC1 or VCC2. Thus, the ESD protection device 500a or 500b as shown in FIG. 4a or 4b may be respectively parallel connected with a reverse ESD protection device to provide ESD protection occurring from the voltage power supply terminals VCC1 or VCC2. As shown in FIG. 5a, the ESD protection device 500c is constructed by an ESD protection sub-device 500$a_1$ and a reverse ESD protection sub-device 500$a_2$ in a parallel connection, wherein the ESD protection sub-devices 500$a_1$ and 500$a_2$ have the same structure with the ESD protection device 500a as shown in FIG. 4a. As shown in FIG. 5a, first doped regions 202$a_1$ and 202$a_2$, second doped regions 204$a_1$ and 204$a_2$, third doped regions 206$a_1$ and 206$a_2$ and first wells 208$a_1$ and 208$a_2$ respectively have the same formation positions and conductive types with that of the first doped region 202, the second doped region 204, the third doped region 206 and the first well 208 of the ESD protection device 500a as shown in FIG. 4a. As shown in FIG. 5a, the first doped region 202a₁ of the ESD protection sub-device 500a₁, the second and third doped regions 204a₂ and 206a₂ of the ESD protection sub-device 500a₂ are coupled to the voltage power supply terminal VCC1 of the first circuit 250a. The second and third doped regions 204a₁ and 206a₁ of the ESD protection sub-device 500a₁ and the first doped region 202a₂ of the ESD protection sub-device 500a₂ are coupled to the voltage power supply terminal VCC2 of the second circuit 250b.

Additionally, as shown in FIG. 5b, the ESD protection device 500d is constructed by an ESD protection sub-device 500b₁ and a reverse ESD protection sub-device 500b₂ in a parallel connection, wherein the ESD protection sub-devices 500b₁ and 500b₂ have the same structure with the ESD protection device 500b as shown in FIG. 4b. As shown in FIG. 5b, first doped regions 202b₁ and 202b₂, second doped regions 204b₁ and 204b₂, third doped regions 206b₁ and 206b₂ and first wells 208b₁ and 208b₂ respectively have the same formation positions and conductive types with that of the first doped region 202, the second doped region 204, the third doped region 206 and the first well 208 of the ESD protection device 500 as shown in FIG. 4b. As shown in FIG. 5b, the first doped region 202b₁ of the ESD protection sub-device 500b₁, the second and third doped regions 204b₂ and 206b₂ of the ESD protection sub-device 500b₂ are coupled to the voltage power supply terminal VCC1 of the first circuit 250a. The second and third doped regions 204b₁ and 206b₁ of the ESD protection sub-device 500b₁ and the first doped region 202b₂ of the ESD protection sub-device 500b₂ are coupled to the voltage power supply terminal VCC2 of the second circuit 250b.

Alternatively, ESD may occur from the ground terminal GND1 of the first circuit 250a or the ground terminal GND2 of the second circuit 250b. Therefore, the ESD protection device 500c may respectively be coupled to the ground terminal GND1 of the first circuit 250a and the ground terminal GND2 of the second circuit 250b, wherein the first doped region 202a₁ of the ESD protection sub-device 500a₁, the second and third doped regions 204a₂ and 206a₂ of the ESD protection sub-device 500a₂ are coupled to the ground terminal GND1 of the first circuit 250a. The second and third doped regions 204a₁ and 206a₁ of the ESD protection sub-device 500a₁ and the first doped region 202a₂ of the ESD protection sub-device 500a₂ are coupled to the ground terminal GND2 of the second circuit 250b to provide ESD protection occurring from the voltage power supply terminals GND1 or GND2. Similarly, the ESD protection device 500d may respectively be coupled to the ground terminal GND1 of the first circuit 250a and the ground terminal GND2 of the second circuit 250b to provide ESD protection occurring from the ground terminals GND1 or GND2.

Figure 5C:
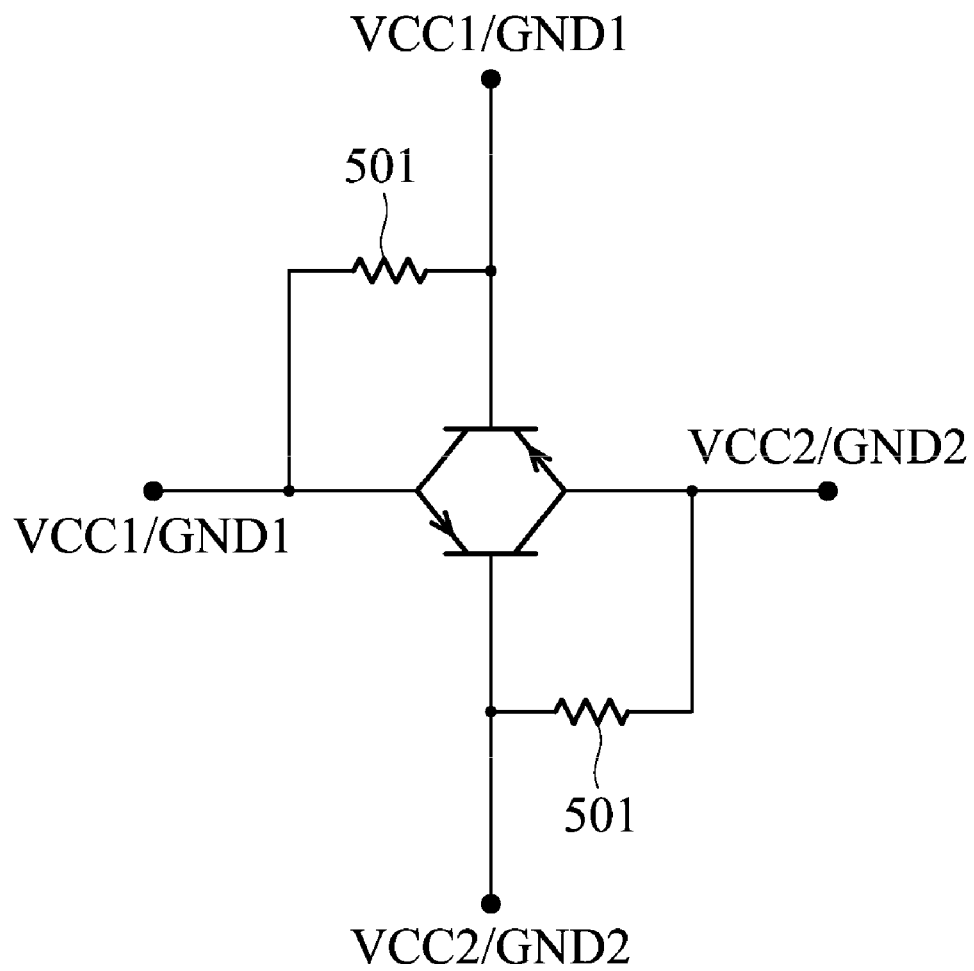
FIG. 5c is an equivalent circuit diagram of FIG. 5a and FIG. 5b.

FIG. 5c is an equivalent circuit diagram of FIGS. 5a and FIG. 5b. The ESD protection devices 500c or 500d may serve as ESD protection devices constructed by a parasitic PNP BJT 500a₁ and a reverse parasitic PNP BJT 500a₂ in a parallel connection or a parasitic PNP BJT 500b₁ and a reverse parasitic PNP BJT 500b₂ in a parallel connection. A resistor 501 may serve as a resistor providing internal resistance for the N-type first wells 208a₁, 208a₂, 208b₁ and 208b₂. The resistor 501 may be ignored during operation because the base and the collector of the parasitic PNP BJT 500a₁ are coupled to the voltage power supply terminal VCC2 or the ground terminal GND2 of the second circuit 250b as shown in FIG. 3. Also, the resistor 501 may be ignored during operation because the base and the collector of the parasitic PNP BJT 500a₁ are coupled to the voltage power supply terminal VCC1 or the ground terminal GND1 of the first circuit 250a as shown in FIG. 3. That is to say, the resistor 501 can be omitted from FIG. 5c. The ESD protection devices 500c or 500d may provide ESD protection occurring from the voltage power supply terminal VCC1/ground terminal GND1 of the first circuit 250a or the voltage power supply terminal VCC2/ground terminal GND2 of the second circuit 250b. If the voltage power supply terminal/ground terminal of one of the circuit encounters ESD current zapping, the ESD protection device 500c or 500d would transmit the ESD transient current from the voltage power supply terminal/ground terminal of the one circuit to the voltage power supply terminal/ground terminal of another circuit, thereby reducing voltage difference of the voltage power supply terminals/ground terminals between the two circuits. Additionally, the ESD voltage from the voltage power supply terminal VCC1/ground terminal GND1 of the first circuit 250a or the voltage power supply terminal VCC2/ground terminal GND2 of the second circuit 250b is smaller than that of the turn on voltage of the parasitic PNP BJT 500c or 500d, which is constructed by a parasitic PNP BJT and a reverse parasitic PNP BJT in a parallel connection. The parasitic PNP BJT 500c or 500d may have noise isolation efficiency.

Figure 6A:
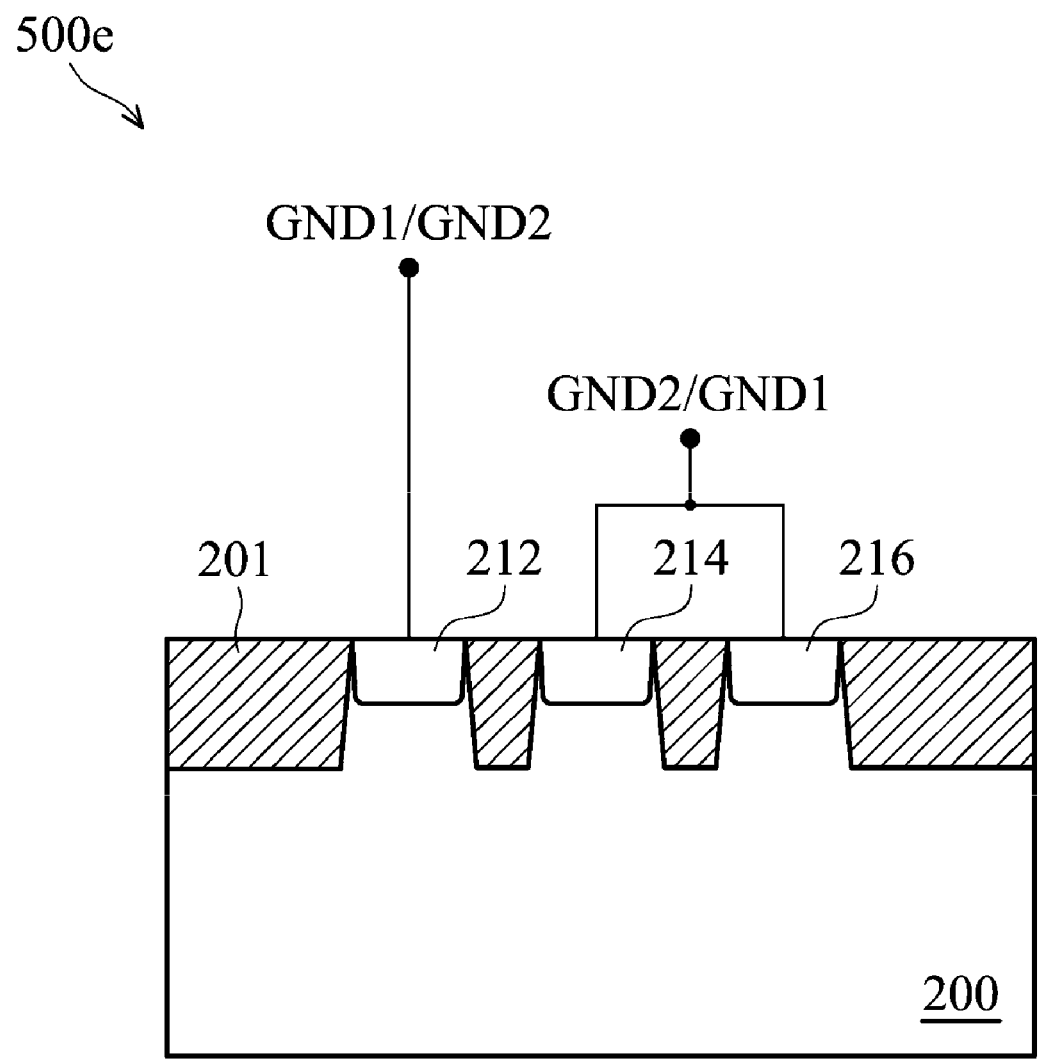
FIG. 6a is a cross section view showing yet another exemplary embodiment of the electrostatic discharge protection device of the invention.

FIG. 6a is a cross section view showing one exemplary embodiment of the ESD protection device 500e of the invention. As shown in FIG. 6a, the ESD protection device 500e is disposed in a substrate 200. The ESD protection device 500e may comprise a fourth doped region 212, a fifth doped region 214 and a sixth doped region 216 separated by a plurality of the STI features 201, wherein the fourth doped region 212 may be coupled to the ground terminal GND1 of the first circuit 250a as shown in FIG. 3. Also, the fifth doped region 214 and the sixth doped region 216 may be coupled to the ground terminal GND2 of the second circuit 250b as shown in FIG. 3.

Figure 6B:
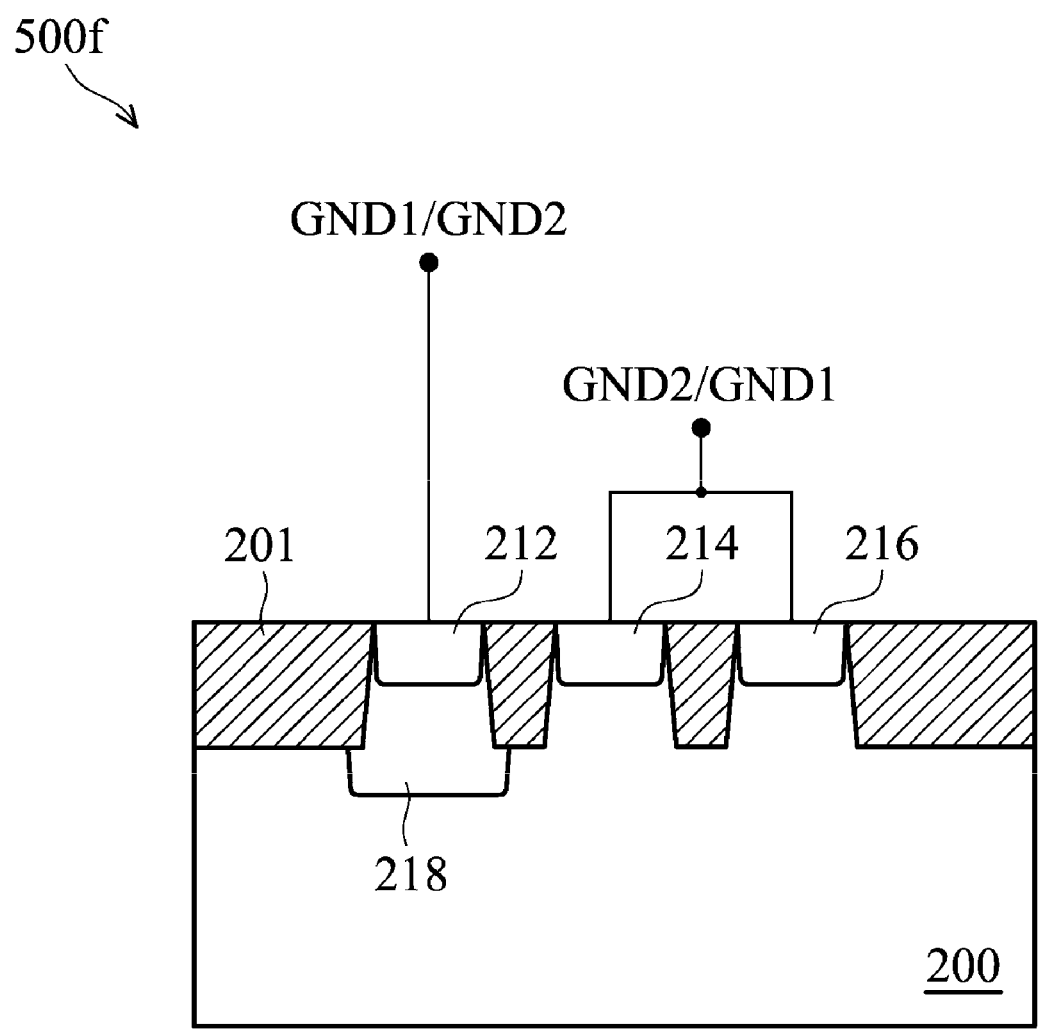
FIG. 6b is a cross section view showing yet another exemplary embodiment of the electrostatic discharge protection device of the invention.

FIG. 6b is a cross section view showing one exemplary embodiment of the ESD protection device 500f of the invention. In another embodiment, the fourth doped region 212 is in a second well 218.

In embodiments as shown in FIGS. 6a and 6b, the fourth doped region 212, the fifth doped region 214 and the second well 218 may have different conductive types than that of the substrate 200. The sixth doped region 216 may have the same conductive type with that of the substrate 200. Additionally, the dopant concentration of the fourth doped region 212 and the fifth doped region 214 may be larger than that of the second well 218. The dopant concentration of the sixth doped region 216 may be larger than that of the substrate 200. For example, if the substrate 200 is P-type, the conductive type of the fourth doped region 212, the fifth doped region 214 and the second well 218 are N-type. The conductive type of the sixth doped region 216 is P-type. In embodiments as shown in FIGS. 6a and 6b, if the conductive type of the substrate 200 is P-type, the ESD protection device 500e may serve as a parasitic NPN bipolar transistor (NPN BJT) 500e constructed by the fourth doped region 212 (e.g. N-doped region), the substrate 200 (e.g. P-type substrate) and the fifth doped region 214 (e.g. N-doped region). The N-type fourth doped region 212 may serve as an emitter of the parasitic NPN BJT 500e. The P-type substrate 200 and the P-type sixth doped region 216 may serve as a base of the parasitic NPN BJT 500e. The N-type fifth doped region 214 may serve as a collector of the parasitic NPN BJT 500e.

Similarly, in embodiments as shown in FIG. 6b, if the conductive type of the substrate 200 is P-type, the ESD protection device 500f may serve as a parasitic NPN bipolar transistor (NPN BJT) 500f constructed by the fourth doped region 212 (e.g. N-doped region), the second well 218 (e.g. N-well), the substrate 200 (e.g. P-type substrate) and the fifth doped region 214 (e.g. N-doped region). The N-type fourth doped region 212 and the N-type second well 218 may serve as an emitter of the parasitic NPN BJT 500f. The P-type substrate 200 and the P-type sixth doped region 216 may serve as a base of the parasitic NPN BJT 500f. The N-type fifth doped region 214 may serve as a collector of the parasitic NPN BJT 500f.

Figure 6C:
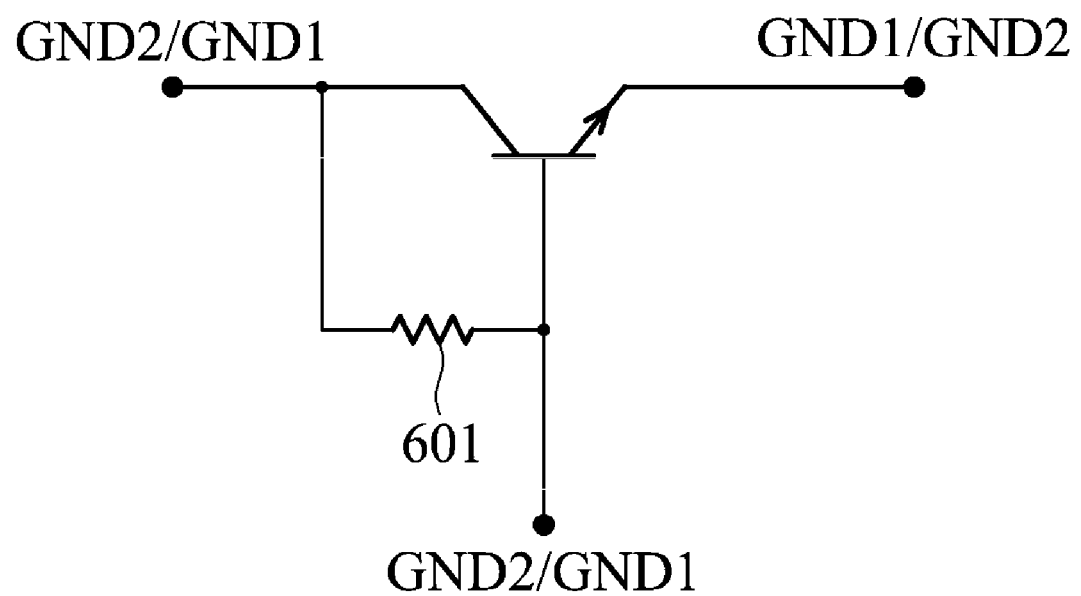
FIG. 6c is an equivalent circuit diagram of FIG. 6a and FIG. 6b.

FIG. 6c is an equivalent circuit diagram of the ESD protection devices 500e or 500f as shown in FIG. 6a and FIG. 6b. A resistor 601 may serve as a resistor providing internal resistance for the P-type substrate 200. The resistor 601 may be ignored during operation because the base and the collector of the parasitic NPN BJT 500e or 500f are coupled to the ground terminal GND2 of the second circuit 250b as shown in FIG. 3. That is to say, the resistor 601 can be omitted from FIG. 6c. If the ground terminal GND1 of the first circuit 250a encounters ESD current zapping, the ESD protection device 500e or 500f would transmit the ESD transient current from the v ground terminal GND1 of the first circuit 250a to the ground terminal GND2 of the second circuit 250b, thereby reducing voltage difference of between the ground terminals GND1 and GND2. Additionally, the ESD voltage from the ground terminal GND1 of the first circuit 250a is smaller than that of the turn on voltage of the NPN BJT 500e or 500f. The parasitic NPN BJT 500e or 500f may have noise isolation efficiency.

It is noted that in embodiments as shown in FIGS. 6a to 6c, the ESD protection device is disposed between the ground terminals GND1 and GND2 of the first circuit 250a and the second circuit 250b as shown in FIG. 3. Those skilled in the art may dispose the ESD protection device between the power supply terminals VCC1 and VCC2 of the first circuit 250a and the second circuit 250b as shown in FIG. 3. Elements of the embodiments hereinafter, that are the same or similar as those previously described with reference to FIGS. 6a to 6c, are not repeated for brevity.

Figure 7A:
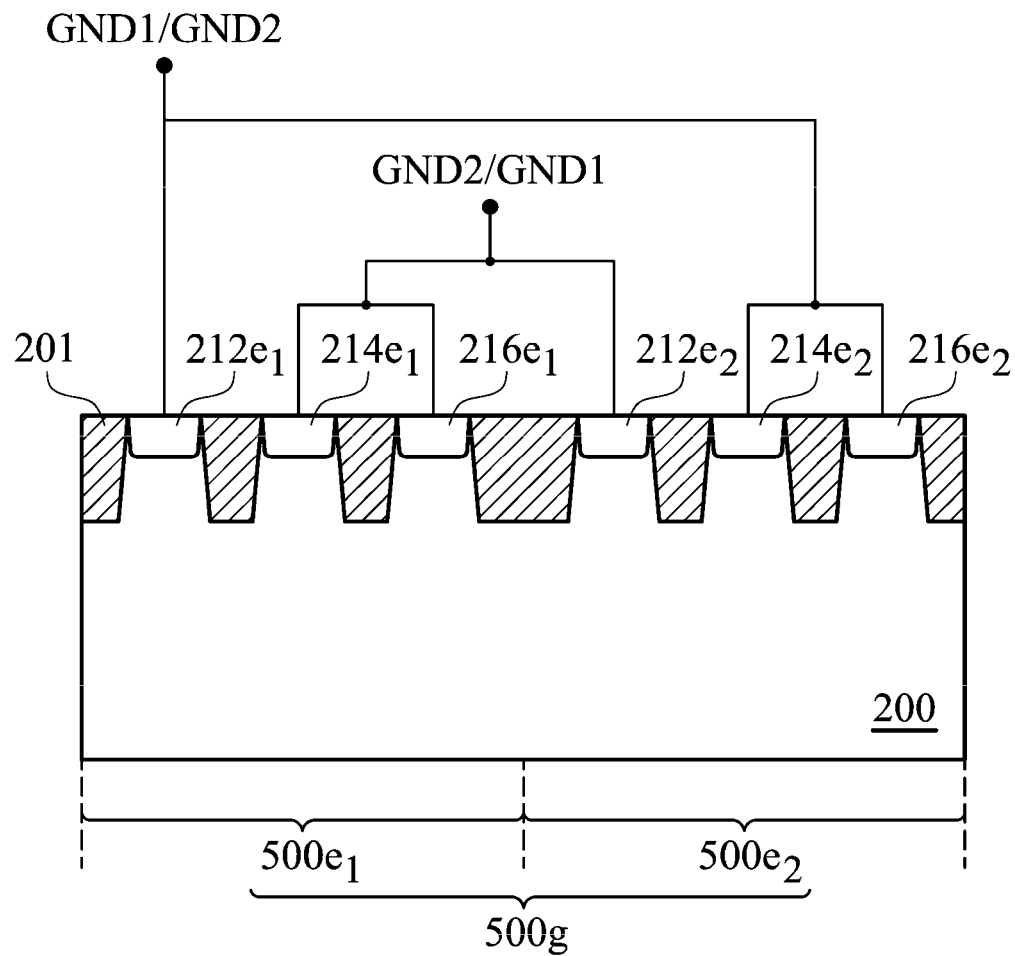
FIGS. 7a and 7b are cross section views showing yet other exemplary embodiments of the electrostatic discharge protection devices of the invention.
Figure 7B:
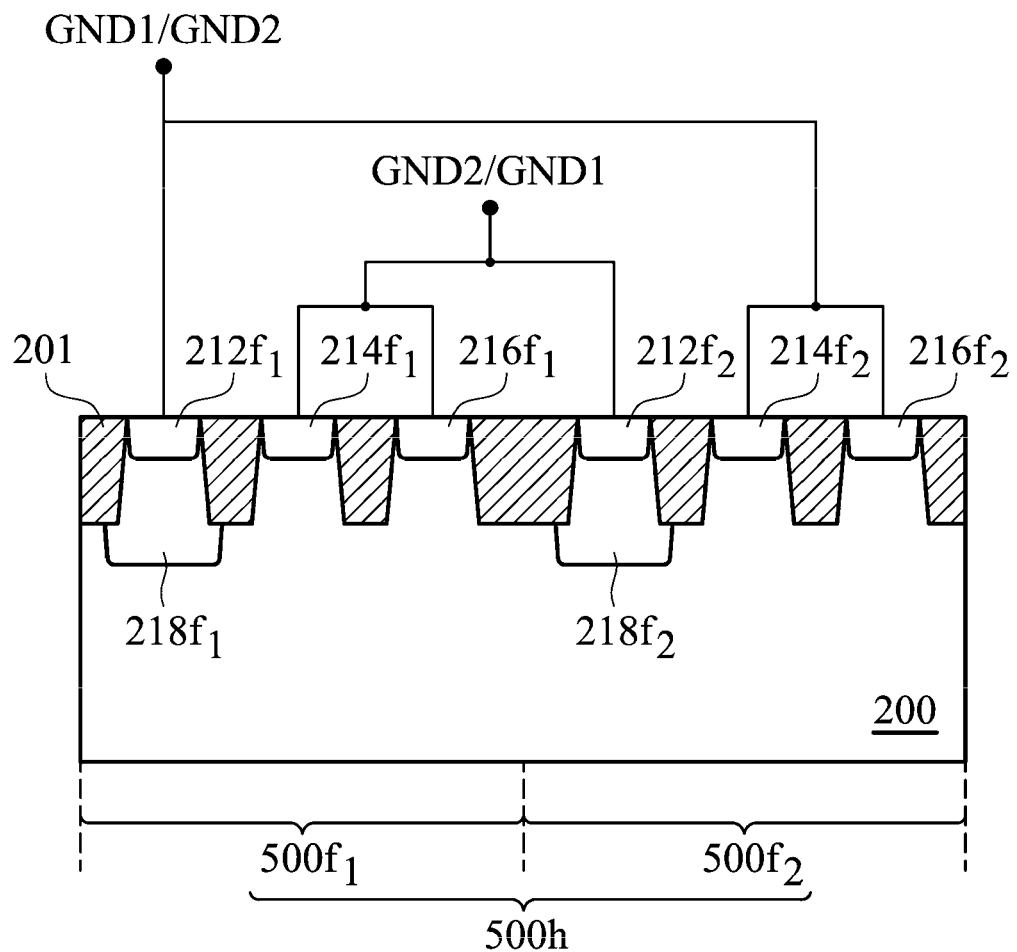

FIGS. 7a and 7b are cross section views showing yet other exemplary embodiments of the electrostatic discharge protection devices 500g and 500h of the invention. Alternatively, ESD may occur from the ground terminals GND1 or GND2. Thus, the ESD protection devices 500e or 500f as shown in FIG. 6a or 6b may be respectively parallel connected with a reverse ESD protection device to provide ESD protection occurring from the ground terminals GND1 or GND2. As shown in FIG. 7a, the ESD protection device 500g is constructed by an ESD protection sub-device $500e_1$ and a reverse ESD protection sub-device $500e_2$ in a parallel connection, wherein the ESD protection sub-devices $500e_1$ and $500e_2$ have the same structure with the ESD protection device 500e as shown in FIG. 6a. As shown in FIG. 7a, fourth doped regions $212e_1$ and $212e_2$, fifth doped regions $214e_1$ and $214e_2$, and sixth doped regions $216e_1$ and $216e_2$ respectively have the same formation positions and conductive types with that of the fourth doped region 212e, the fifth doped region 214e, and the sixth doped region 216e of the ESD protection device 500e as shown in FIG. 6a. As shown in FIG. 7a, the fourth doped region $212e_1$ of the ESD protection sub-device $500e_1$ and the fifth and sixth doped regions $214e_2$ and $216e_2$ of the ESD protection sub-device $500e_2$ are coupled to the ground terminal GND1 of the first circuit 250a or the ground terminal GND2 of the second circuit 250b. The fifth and sixth doped regions $214e_1$ and $216e_1$ of the ESD protection sub-device $500e_1$ and the fourth doped region $212e_2$ of the ESD protection sub-device $500e_2$ are coupled to the ground terminal GND2 of the second circuit 250b or the ground terminal GND1 of the first circuit 250a.

Additionally, as shown in FIG. 7b, the ESD protection device 500h is constructed by an ESD protection sub-device $500f_1$ and a reverse ESD protection sub-device $500f_2$ in a parallel connection, wherein the ESD protection sub-devices $500f_1$ and $500f_2$ have the same structure with the ESD protection device 500f as shown in FIG. 6b. As shown in FIG. 7b, fourth doped regions $212f_1$ and $212f_2$, fifth doped regions $214f_1$ and $214f_2$, sixth doped regions $216f_1$ and $216f_2$ and second wells $218f_1$ and $218f_2$ respectively have the same formation positions and conductive types with that of the first doped region 202, the second doped region 204, the third doped region 206 and the first well 208 of the ESD protection device 500f as shown in FIG. 6b. As shown in FIG. 7b, the fourth doped region $212f_1$ of the ESD protection sub-device $500f_1$ and the fifth and sixth doped regions $214f_2$ and $216f_2$ of the ESD protection sub-device $500f_2$ are coupled to the ground terminal GND1 of the first circuit 250a or the ground terminal GND2 of the second circuit 250b. The fifth and sixth doped regions $214f_1$ and $216f_1$ of the ESD protection sub-device $500f_1$ and the fourth doped region $212f_2$ of the ESD protection sub-device $500f_2$ are coupled to the corresponding ground terminal GND2 of the second circuit 250b or the corresponding ground terminal GND1 of the first circuit 250a.

Figure 7C:
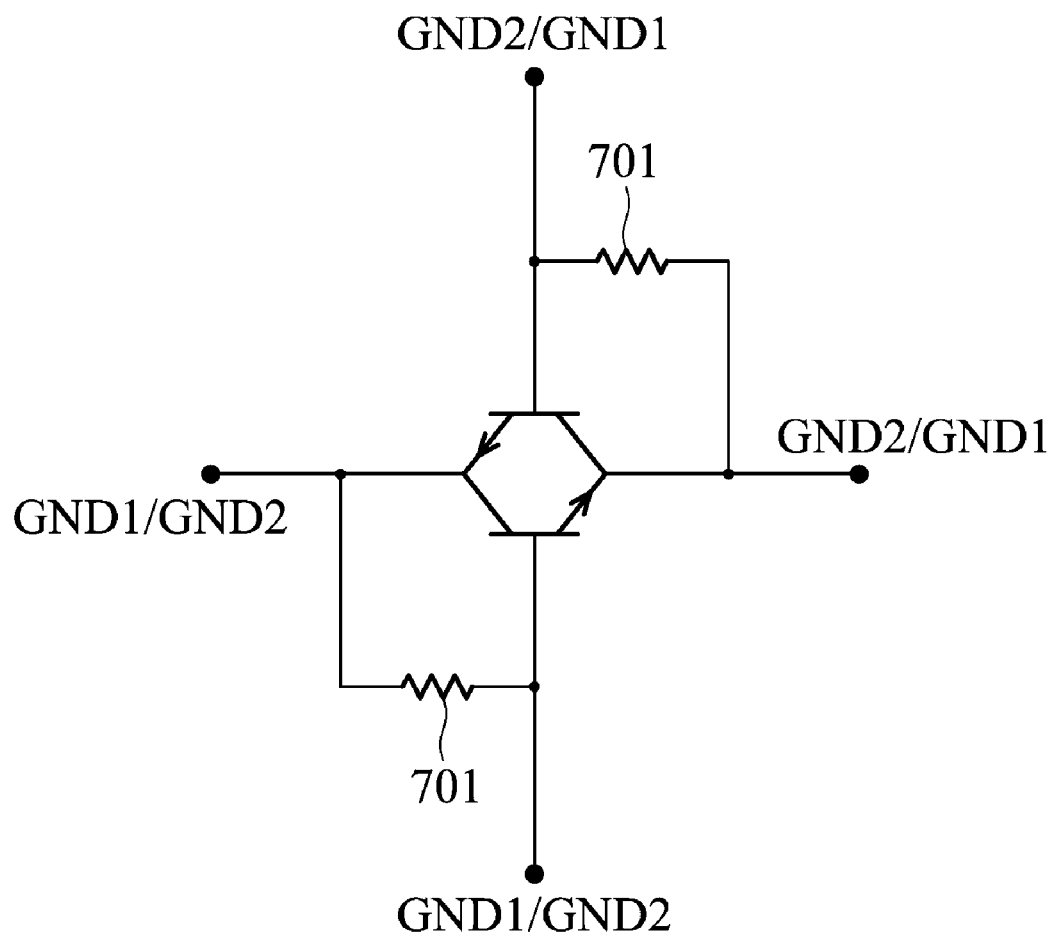
FIG. 7c is an equivalent circuit diagram of FIG. 7a and FIG. 7b.

FIG. 7c is an equivalent circuit diagram of FIGS. 7a and FIG. 7b. The ESD protection devices 500g or 500h may serve as ESD protection devices constructed by a parasitic NPN BJT $500e_1$ and a reverse parasitic NPN BJT $500e_2$ in a parallel connection or a parasitic NPN BJT $500f_1$ and a reverse parasitic NPN BJT $500f_2$ in a parallel connection. A resistor 701 as shown in FIG. 7c may serve as a resistor providing internal resistance for the P-type substrate 200. The resistor 701 may be ignored during operation because the base and the collector of the parasitic NPN BJT $500e_1$ are coupled to the ground terminal GND1 of the first circuit 250a/the ground terminal GND2 of the second circuit 250b as shown in FIG. 3. Also, the resistor 701 may be ignored during operation because the base and the collector of the parasitic NPN BJT $500e_2$ are coupled to the ground terminal GND2 of the second circuit 250b/the ground terminal GND1 of the first circuit 250a as shown in FIG. 3. That is to say, the resistor 701 can be omitted from FIG. 7c. The ESD protection devices 500g or 500h may provide ESD protection occurring from the ground terminal GND1 of the first circuit 250a or the ground terminal GND2 of the second circuit 250b. If the ground terminal of one of the circuit encounters ESD current zapping, the ESD protection device 500g or 500h would transmit the ESD transient current from the ground terminal of the one circuit to the corresponding ground terminal of another circuit, thereby reducing voltage difference of the ground terminals between the two circuits. Additionally, the ESD voltage from the ground terminal GND1 of the first circuit 250a or the ground terminal GND2 of the second circuit 250b is smaller than that of the turn on voltage of the parasitic PNP BJT 500g or 500h, which is constructed by a parasitic NPN BJT and a reverse parasitic NPN BJT in a parallel connection. The parasitic NPN BJT 500g or 500h may have noise isolation efficiency.

It is noted that in embodiments as shown in FIGS. 7a to 7c, the ESD protection device is disposed between the ground terminals GND1 and GND2 of the first circuit 250a and the second circuit 250b as shown in FIG. 3. Those skilled in the art may dispose the ESD protection device between the power supply terminals VCC1 and VCC2 of the first circuit 250a and the second circuit 250b as shown in FIG. 3. It is noted that skill in the art may accomplish the ESD protection device as shown in FIG. 7c constructed by the ESD protection devices as shown in FIGS. 6a and 6b.

One exemplary embodiment of the ESD protection device constructed by BJT devices is used to provide an ESD path between the power supply terminals or the ground terminals of two circuits. Therefore, the ESD protection device may be especially applied to a power cut cell between two circuits. Compared with the conventional power cut cell constructed by MOS devices, one exemplary embodiment of the ESD protection device constructed by BJT devices may have larger current. Thus, the ESD protection devices may provide ESD protection occurring from the voltage power supply terminal/ground terminal of one of the circuits or the voltage power supply terminal/ground terminal of another one of the circuits. If the voltage power supply terminal/ground terminal of one of the circuits encounters ESD current zapping, the ESD protection device would transmit the ESD transient current from the voltage power supply terminal/ground terminal of the one circuit to the voltage power supply terminal/ground terminal of another circuit, thereby reducing voltage difference of the voltage power supply terminals/ground terminals between the two circuits. Additionally, the ESD voltage from the voltage power supply terminal/ground terminal of one of the circuits is smaller than that of the turn on voltage of the ESD protection device constructed by BJT devices. The ESD protection device may have noise isolation efficiency. Moreover, the ESD protection device constructed by BJT devices has a larger turn on voltage than that of the conventional power cut cell constructed by MOS devices. Therefore, the ESD protection device constructed by BJT devices has much better noise isolation efficiency than that of the conventional power cut cell constructed by MOS devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection (ESD) device formed in a substrate, for providing an ESD path between a first circuit and a second circuit, the ESD device comprising:
   a first doped region having a first conductive type;
   a first well having a second conductive type opposite to the first conductive type; and
   a second doped region and a third doped region in the first well, respectively having the first and second conductive types, wherein the first doped region is coupled to a power supply terminal or a ground terminal of the first circuit, and the second and third doped regions are both coupled to a power supply terminal or a ground terminal of the second circuit, respectively.

2. The electrostatic discharge protection device as claimed in claim 1, wherein the first doped region, the second doped region and the third doped region are separated by a plurality of shallow trench isolation features, and the first doped region, the second doped region and the third doped region are adjacent to a surface of the substrate.

3. The electrostatic discharge protection device as claimed in claim 1, wherein the substrate is a P-type substrate, the first conductive type is P-type and the second conductive type is N-type.

4. The electrostatic discharge protection device as claimed in claim 3, wherein the first doped region, the first well and the second doped region form an PNP bipolar transistor, wherein the first doped region, the first well and the second doped region are respectively an emitter, a base and a collector of the PNP bipolar transistor.

5. The electrostatic discharge protection device as claimed in claim 1, wherein the first doped region is the first well.

6. The electrostatic discharge protection device as claimed in claim 1, wherein the first doped region of each of the ESD sub-devices is in the first well.

7. An electrostatic discharge protection (ESD) device formed in a substrate, for providing an ESD path between a first circuit and a second circuit, wherein the ESD device comprises at least two ESD sub-devices, and each of the ESD sub-devices comprises:
   a first doped region having a first conductive type;
   a first well having a second conductive type opposite to the first conductive type; and
   a second doped region and a third doped region in the first well, respectively having the first and second conductive types,
   wherein the first doped region of one of the ESD sub-devices and the second and third doped regions of another one of the ESD sub-devices are coupled to a power supply terminal or a ground terminal of the first circuit, and the second and third doped regions of one of the ESD sub-devices and the first doped region of another one of the ESD sub-devices are both coupled to a power supply terminal or a ground terminal of the second circuit, respectively.

8. The electrostatic discharge protection device as claimed in claim 7, wherein the first doped region, the second doped region and the third doped region are separated by a plurality of shallow trench isolation features, and the first doped region, the second doped region and the third doped region are adjacent to a surface of the substrate.

9. The electrostatic discharge protection device as claimed in claim 7, wherein the first well of each of the ESD sub-devices are separated by at least one shallow trench isolation feature.

10. The electrostatic discharge protection device as claimed in claim 7, wherein the substrate is a P-type substrate, the first conductive type is P-type and the second conductive type is N-type.

11. The electrostatic discharge protection device as claimed in claim 9, wherein the first doped region, the first well and the second doped region of each of the ESD sub-devices form an PNP bipolar transistor, wherein the first doped region, the first well and the second doped region of each of the ESD sub-devices are respectively an emitter, a base and a collector of the PNP bipolar transistor.

12. An electrostatic discharge protection (ESD) device formed in a substrate, for providing an ESD path between a first circuit and a second circuit, the ESD device comprising:
   a first doped region having a first conductive type; and
   a second doped region and a third doped region, respectively having the first conductive type and a second conductive type opposite to the first conductive type,
   wherein the first doped region is coupled to a power supply terminal or a ground terminal of the first circuit, and the second and third doped regions are both coupled to a power supply terminal or a ground terminal of the second circuit, respectively.

13. The electrostatic discharge protection device as claimed in claim 12, wherein the first doped region, the second doped region and the third doped region are separated by a plurality of shallow trench isolation features, and the first doped region, the second doped region and the third doped region are adjacent to a surface of the substrate.

14. The electrostatic discharge protection device as claimed in claim 12, wherein the substrate is a P-type substrate, the first conductive type is N-type and the second conductive type is P-type.

15. The electrostatic discharge protection device as claimed in claim 14, wherein the first doped region, the substrate and the second doped region form an NPN bipolar transistor, wherein the first doped region, the third doped region and the second doped region are respectively an emitter, a base and a collector of the NPN bipolar transistor.

16. The electrostatic discharge protection device as claimed in claim 12, further comprising:
a first well having the first conductive type, surrounding the first doped region.

17. An electrostatic discharge protection (ESD) device formed in a substrate, for providing an ESD path between a first circuit and a second circuit, wherein the ESD device comprises at least two ESD sub-devices, and each of the ESD sub-devices comprises:
a first doped region having a first conductive type; and
a second doped region and a third doped region respectively having the first conductive type and a second conductive type opposite to the first conductive type,
wherein the first doped region of one of the ESD sub-devices and the second and third doped regions of another one of the ESD sub-devices are coupled to a power supply terminal or a ground terminal of the first circuit, and the second and third doped regions of one of the ESD sub-devices and the first doped region of another one of the ESD sub-devices are both coupled to a power supply terminal or a ground terminal of the second circuit, respectively.

18. The electrostatic discharge protection device as claimed in claim 17, wherein the first doped region, the second doped region and the third doped region of each of the ESD sub-devices are separated by a plurality of shallow trench isolation features, and the first doped region, the second doped region and the third doped region are adjacent to a surface of the substrate.

19. The electrostatic discharge protection device as claimed in claim 17, wherein the substrate is a P-type substrate, the first conductive type is N-type and the second conductive type is P-type.

20. The electrostatic discharge protection device as claimed in claim 19, wherein the first doped region, the substrate and the second doped region of each of the ESD sub-devices form an NPN bipolar transistor, wherein the first doped region, the third doped region and the second doped region of each of the ESD sub-devices are respectively an emitter, a base and a collector of the NPN bipolar transistor.

21. The electrostatic discharge protection device as claimed in claim 17, wherein each of the ESD sub-devices further comprises:
a first well having the first conductive type, surrounding the first doped region.

22. The electrostatic discharge protection device as claimed in claim 21, wherein the first well of each of the ESD sub-devices are separated by at least one shallow trench isolation feature.

* * * * *